United States Patent
Roy et al.

(10) Patent No.: US 10,916,303 B2
(45) Date of Patent: Feb. 9, 2021

(54) RESISTIVE MEMORY APPARATUS AND METHOD OF OPERATING A RESISTIVE MEMORY APPARATUS

(71) Applicant: NXP USA, Inc., Austin, TX (US)

(72) Inventors: Anirban Roy, Austin, TX (US); Yanzhe Tang, Shanghai (CN)

(73) Assignee: NXP USA, Inc., Austin, TX (US)

(*) Notice: Subject to any disclaimer, the term of this patent is extended or adjusted under 35 U.S.C. 154(b) by 16 days.

(21) Appl. No.: 16/410,963

(22) Filed: May 13, 2019

(65) Prior Publication Data
US 2020/0211643 A1   Jul. 2, 2020

(30) Foreign Application Priority Data

Dec. 28, 2018 (CN) .......................... 2018 1 1621102

(51) Int. Cl.
G11C 13/00 (2006.01)
(52) U.S. Cl.
CPC ........ *G11C 13/0026* (2013.01); *G11C 13/004* (2013.01); *G11C 13/0069* (2013.01)
(58) Field of Classification Search
CPC ................................................ G11C 13/0026
See application file for complete search history.

(56) References Cited

U.S. PATENT DOCUMENTS

| | | | |
|---|---|---|---|
| 8,045,361 B2 | 10/2011 | Lee et al. | |
| 8,593,854 B1 | 11/2013 | Chih et al. | |
| 8,730,708 B2 | 5/2014 | Chen | |
| 2006/0023531 A1* | 2/2006 | Crippa | G11C 11/5642 365/203 |
| 2007/0097754 A1* | 5/2007 | Spitz | G11C 7/12 365/189.06 |
| 2019/0080754 A1* | 3/2019 | Tran | H01L 45/122 |

FOREIGN PATENT DOCUMENTS

CN     103839585 A    6/2014

OTHER PUBLICATIONS

Tang, Yan Zhe et al. "A Novel RRAM Stack with TaOx/HfOy Double-Switching-Layer Configuration Showing Low Operation Current Through Complimentary Switching of Back-to-Back Connected Subcells", IEEE Electron Device Letters, vol. 35, No. 6, pp. 627-629, Jun. 2014.

* cited by examiner

*Primary Examiner* — Douglas King

(57) ABSTRACT

A resistive memory apparatus and a method of operating a resistive memory apparatus are disclosed. In an embodiment, a resistive memory apparatus can include a memory cell that includes at least two transistors and a resistive element. The resistive memory apparatus can further include a bit line through which data is exchanged with the memory cell, wherein the bit line electronically interconnects with the memory cell, and a bit line regulator connected to the bit line. The bit line regulator can regulate the bit line based on the state of the resistive element. The forming signals and voltage settings can be transmitted over the bit line regulator and across the bit line to the memory cell.

20 Claims, 8 Drawing Sheets

| | 1(SEL) | 2(ROW) | SET/FORMING 3(COL) | 4(DIAGONAL) |
|---|---|---|---|---|
| Vbl(V) | Vset/Vform | 0 | Vset/Vform | 0 |
| Vsl(V) | 0 | 0 | 0 | 0 |
| Vwl(V) | Vwls | Vwls | 0 | 0 |
| Vsc(V) | Vwls | 0 | Vwls | Vwls |
| Vrs(V) | 0 | 0 | 0 | 0 |
| Vnw(V) | Vset/Vform | 0 | Vset/Vform | 0 |

FIG. 4

| | | RESET | | |
|---|---|---|---|---|
| | 1(SEL) | 2(ROW) | 3(COL) | 4(DIAGONAL) |
| Vbl(V) | 0 | 0 | 0 | 0 |
| Vsl(V) | Vreset | 0 | Vreset | 0 |
| Vwl(V) | Vwlrs | Vwlrs | 0 | 0 |
| Vsc(V) | 0 | 0 | 0 | 0 |
| Vrs(V) | 0 | 0 | 0 | 0 |
| Vnw(V) | 0 | 0 | 0 | 0 |

FIG. 6

| | 1(SEL) | 2(ROW) | READ<br>3(COL) | 4(DIAGONAL) |
|---|---|---|---|---|
| Vbl(V) | 0 | 0 | 0 | 0 |
| Vsl(V) | Vread | 0 | Vread | 0 |
| Vwl(V) | Vwlr | Vwlr | 0 | 0 |
| Vsc(V) | 0 | 0 | 0 | 0 |
| Vrs(V) | 0 | 0 | 0 | 0 |
| Vnw(V) | 0 | 0 | 0 | 0 |

FIG. 7

RESISTIVE MEMORY APPARATUS AND METHOD OF OPERATING A RESISTIVE MEMORY APPARATUS

CROSS-REFERENCE TO RELATED APPLICATION

This patent application claims the benefit under 35 U.S.C. § 119(a) of a Chinese patent application filed on Dec. 28, 2018 in the State Intellectual Property Office and assigned Serial number 201811621102.X, the entire disclosure of which is hereby incorporated by reference.

BACKGROUND

Non-volatile memories can be utilized in a wide variety of commercial and military electronic devices and equipment. RRAM (Resistive Random Access Memory) is a promising candidate for next generation non-volatile memory technology due to its simple structure and CMOS (Complementary Metal Oxide Semiconductor) logic compatible process technology that is involved in the formation and operation of the RRAM.

RRAM, also known as ReRAM, is a form of nonvolatile storage that can operate by changing the resistance of a specially formulated solid dielectric material. A RRAM cell can include a metal oxide material sandwiched between top and bottom electrodes. This metal oxide material can possess a variable resistance whose resistance level can correspond to a data state stored in the RRAM cell.

SUMMARY

Embodiments of a resistive memory apparatus and a method of operating the resistive memory apparatus are disclosed. In an embodiment, a resistive memory apparatus can include a memory cell that can comprise at least two transistors and a resistive element. The resistive memory apparatus can further include a bit line through which data can be exchanged with the memory cell, wherein the bit line electronically interconnects with the memory cell. The resistive memory apparatus can further include a bit line regulator connected to the bit line, wherein the bit line regulator regulates the bit line based on a state of the resistive element. Forming signals and voltage settings can be transmitted over the bit line regulator and across the bit line to the memory cell.

In an embodiment, the resistive element can include a variable resistor.

In an embodiment, the bit line regulator can be introduced to the memory cell during a forming operation in which the forming signals can be transmitted to the memory cell.

In an embodiment, the resistive memory apparatus can further include a word line, a source line and an intermediate sense line that interconnect with the memory cell.

In an embodiment, the bit line regulator can include a capacitor divider that connects to the intermediate sense line during a write operation involving writing data to the memory cell at the bit line.

In an embodiment, the intermediate sense line can connect to the source line in a reset write mode to increase the transistor strength of at least one of the at least two transistors of the memory cell.

In an embodiment, the resistive memory apparatus can comprise a RRAM (Resistive Random Access Memory) that can include the memory cell, the bit line and the bit line regulator.

In an embodiment, the resistive element can comprise a resistive storage element.

In another embodiment, a resistive memory apparatus can include a plurality of memory cells, wherein each memory cell among the plurality of memory cells comprises at least two transistors and a resistive element. Such a resistive memory apparatus can further include a plurality of bit lines through which data can be exchanged with the plurality of memory cells, wherein the plurality of bit lines electronically interconnects with the plurality of memory cells. The resistive memory apparatus can further include at least one bit line regulator connected to the plurality of bit lines, wherein the at least one bit line regulator regulates the plurality of bit lines based on a state of the resistive element. Forming signals and voltage settings can be transmitted over the at least one bit line regulator and across the plurality of bit lines to the plurality of memory cells.

In an embodiment of the resistive memory apparatus, the resistive element can comprise a variable resistor.

In an embodiment of the resistive memory apparatus, the resistive memory apparatus can further include a plurality of word lines, a plurality of source lines and a plurality of intermediate sense lines that interconnect with the plurality of memory cells.

In an embodiment of the resistive memory apparatus, each memory cell among the plurality of memory cells can respectively connect to a word line among the plurality of word lines, a bit line among the plurality of bit lines, a source line among the plurality of source lines, and an intermediate sense line.

In an embodiment of the resistive memory apparatus of claim, the at least one bit line regulator can include a plurality of capacitors that connects to a plurality of transistors, wherein at least one transistor among the plurality of transistors connects to an intermediate sense line and at least one other transistor among the plurality of transistors connects to a bit line among the plurality of bit lines.

In another embodiment, a method of operating a resistive memory apparatus, can involve regulating a bit line with a bit line regulator connected to the bit line, based on a state of a resistive element of a memory cell comprising at least two transistors and the resistive element, wherein the bit line electronically interconnects to the memory cell, and transmitting forming signals and voltage settings over the bit line regulator and across the bit line to the memory cell.

In an embodiment of the method of operating the resistive memory apparatus, the resistive element can comprise a variable resistor.

In an embodiment, the method of operating the resistive memory apparatus can further involve introducing the bit line regulator to the memory cell during a forming operation in which the forming signals are transmitted to the memory cell.

In an embodiment of the method of operating the resistive memory apparatus, the memory cell can interconnect with a word line, a source line and an intermediate sense line.

In an embodiment of the method of operating the resistive memory apparatus, the bit line regulator can include a capacitor divider that connects to the intermediate sense line during a write operation involving writing data to the memory cell at the bit line.

In an embodiment of the method of operating the resistive memory apparatus, the intermediate sense line can connect to the source line in a reset write mode to increase a transistor strength of at least one of the at least two transistors of the memory cell.

In an embodiment of the method of operating the resistive memory apparatus, the resistive memory apparatus can comprise a RRAM (Resistive Random Access Memory) that can include the memory cell, the bit line and the bit line regulator.

BRIEF DESCRIPTION OF THE DRAWINGS

FIG. 4 depicts a table demonstrating selected and unselected bits in a forming/set operation for a resistive memory apparatus;

FIG. 6 depicts a table demonstrating selected and unselected bits in a reset operation for a resistive memory apparatus;

FIG. 7 depicts a table demonstrating selected and unselected bits in a read operation for a resistive memory apparatus.

DETAILED DESCRIPTION

Figure 1:
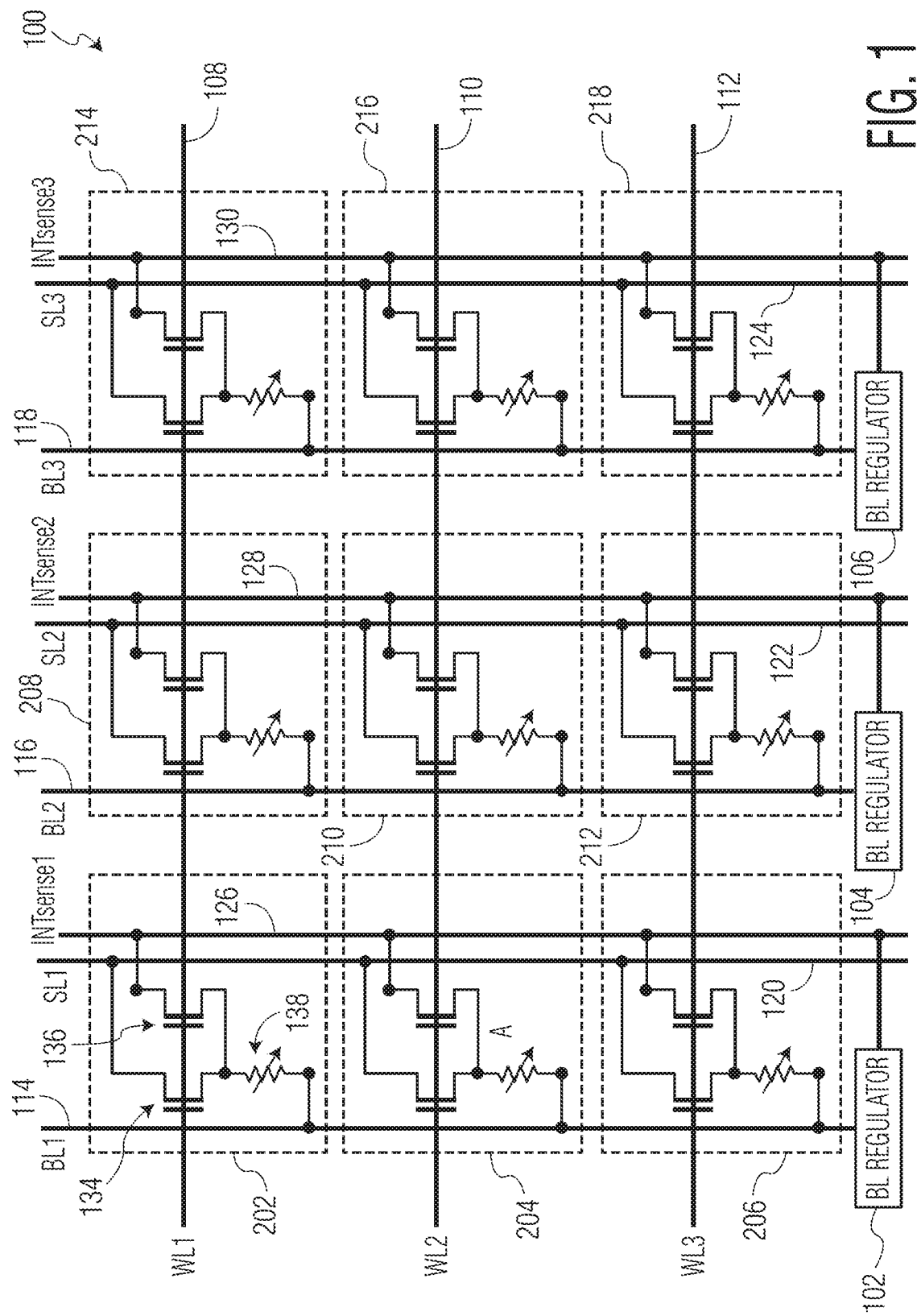
FIG. 1 depicts a circuit diagram of a resistive memory apparatus.

It can be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or characteristics. The described embodiments can be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Language referring to the features and advantages may be understood to mean that a specific feature, advantage, or characteristic described in connection with an embodiment is included in at least one embodiment of the present invention. Thus, discussions of the features and advantages, and similar language, throughout this specification may refer to the same embodiment.

Furthermore, the described features, advantages, and characteristics of the invention may be combined in any suitable manner in one or more embodiments. One skilled in the relevant art can recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may refer to the same embodiment.

Several aspects of the disclosed embodiments are presented with reference to various systems, methods and devices. These systems, methods and devices are described in the following detailed description and illustrated in the accompanying drawings by various blocks, modules, components, circuits, steps, operations, processes, algorithms, engines, applications, etc. (which can be individually or collectively referred to as an "element" or "elements"). These elements may be implemented using electronic hardware, computer software, or any combination thereof. Whether such elements are implemented as hardware or software depends upon the particular application and design constraints imposed on the overall system.

FIG. 1 depicts a circuit diagram of a resistive memory apparatus 100 that includes an array of one or more memory cells 202, 204, 206, 208, 210, 212, 214, 216, and 218, and one or more bit line regulators including a bit line regulator 102, a bit line regulator 104, and a bit line regulator 106. The resistive memory apparatus 100 can be formed as an array that includes the memory cells 202, 204, 206, 208, 210, 212, 214, 216, and 218. Note that the resistive memory apparatus 100 can be a RRAM (Resistive Random Access Memory).

The resistive memory apparatus 100 can further include one or more word lines including a word line 108, a word line 110, and a word line 112. Note that as utilized herein, the acronym WL can refer a "word line". Thus, "WL1" can refer to a first word line, "WL2" can refer to a second word line, "WL3" can refer to a third word line, and so on. The word line 108 (also indicated as "WL1" in FIG. 1) can interact with and connect to the memory cell 202, the memory cell 208, and the memory cell 214. The word line 110 (also shown as "WL2" in FIG. 1) can interact with and connect to the memory cell 204, the memory cell 210, and the memory cell 216. The word line 112 (also shown as "WL3" in FIG. 1) can interact with and connect to the memory cell 206, the memory cell 212, and the memory cell 218.

The resistive memory apparatus 100 can further include one or more bit lines including a bit line 114, a bit line 116, and a bit line 118. Note that as utilized herein the acronym "BL" can refer to a bit line. Thus, "BL1" can refer to a first bit line, "BL2" can refer to a second bit line, "BL3" can refer to a third bit line, and so on.

The bit line 114 (also labeled as "BL1") can interact and interconnect electronically with the memory cell 202, the memory cell 204, and the memory cell 206. The bit line 114 can also connect to the bit line regulator 102. The bit line 116 (also labeled as "BL2") can interact and interconnect electronically with the memory cell 208, the memory cell 210, and the memory cell 212.

In addition, the bit line 116 can also connect to the bit line regulator 104. The bit line 118 (also labeled as "BL3") can interact and interconnect electronically with the memory cell 214, the memory cell 216, and the memory cell 218, and also connect to the bit line regulator 106. Note that the acronyms "BL" and "bl" as used herein refers to "Bit Line" or "bit line". Thus, respective bit lines can be utilized to exchange data with memory cells 202, 204, 206, 208, 210, 212, 214, 216 or 218.

The bit line regulator 102 can regulate the bit line 114 (i.e., "BL1") based on the state of the respective resistive elements within the memory cell 202, the memory cell 204 and the memory cell 206. For example, the bit line regulator 102 can specifically regulate the bit line 114 based on the state of the resistive element 138 of the memory cell 202, and so on.

The bit line regulator 104 can similarly regulate the bit line 116 based on the state of one or more of the respective resistive elements of the memory cell 208, the memory cell 210 and the memory cell 212. Note that the disclosed resistive elements can comprise resistive storage elements such as a variable resistor. The bit line regulator 106 can regulate the bit line 118 based on the state of the respective resistive elements of the memory cell 214, the memory cell 216 and the memory cell 218. As will be discussed in greater detail herein, forming signals and voltage settings can be transmitted over the bit line regulator 102, the bit line regulator 104 or the bit line regulator 106 and across bit line 114, the bit line 116, or the bit line 118 respectively to the memory cells 202, 204, 206, and the memory cells 208, 210, 212, and the memory cells 214, 216, 218.

Note that the term "forming" as utilized herein can relate to a "forming" or "formation" process for the resistive memory apparatus 100 that can be performed to initiate the resistive switching property (e.g., of the resistive storage element of a memory cell) of the memory cells. The forming process can be an electroforming process that can include the formation of an initial conductive filament, which can serve as a switching element for a memory cell. Such a forming process can be performed on fresh memory cells (e.g., to initialize memory cells which may not have experienced set/reset operations) and/or on "tail bits" associated with formation free memory cells (e.g., resistive memory cells that may not require a forming process to initialize a bistable switching capability). The terms "reset" and "set" as utilized herein can respectively relate to a high resistance (reset) state and a low resistance (set) state.

The resistive memory apparatus 100 can also include one or more source lines including a source line 120, a source line 122, and a source line 124. Note that as utilized herein, the acronym "SL" can refer to a "source line". Thus "SL1" can refer to a first source line, "SL2" can refer to a second source line, "SL3" can refer to a third source line, and so on.

The source line 120 (also labeled as "SL1") can interact with and connect to the memory cell 202, the memory cell 204, and the memory cell 206. The source line 122 (also labeled as "SL2") can interact with and connect to the memory cell 208, the memory cell 210, and the memory cell 212. In addition, the source line 124 (also labeled as "SL3") can interact with and connect to the memory cell 214, the memory cell 216, and the memory cell 218.

The resistive memory apparatus 100 can further include one or more intermediate sense lines including an intermediate sense line 126, an intermediate sense line 128, and an intermediate sense line 130. The intermediate sense line 126 (also labeled as "INTsense1") can also interact with and connect to the memory cell 202, the memory cell 204, the memory cell 206, and the bit line regulator 102. The intermediate sense line 128 (also labeled as "INTsense2") can interact with and connect to the memory cell 208, the memory cell 210, the memory cell 212, and the bit line regulator 104. The intermediate sense line 130 (also labeled as "INTsense3") can interact with and connect to the memory cell 214, the memory cell 216, the memory cell 218 and the bit line regulator 106. Thus, each memory cell can interconnect with a word line, a source line and an intermediate sense line.

As shown in FIG. 1, each memory cell 202, 204, 206, 208, 210, 212, 214, 216, and 218 in the array can include two or more transistors and a resistive element. An example of a memory cell that includes two or more transistors and a resistive element is memory cell 202, which can include a transistor 134, a transistor 136, and a resistive element 138, which may be a variable resistor. Note that in the interest of brevity, the other various transistors and resistive elements depicted in FIG. 1 are not discussed in detail. Thus, each memory cell 202, 204, 206, 208, 210, 212, 214, 216, and 218 can include two or more transistors and a resistive element, which may be a variable resistor.

A resistive element, such as the resistive element 138, may be a conductive filament or can be formed from a group of conductive filaments. An applied voltage can form and rupture conducting filaments in a resistive switching layer of the resistive memory apparatus 100, so as to switch the resistive memory apparatus 100 between low-resistance state (LRS) and high-resistance state (HRS), respectively.

Note that LRS and HRS can be states for the individual resistive elements and not the whole array. Since RRAM can be an EEPROM (Electrically Erasable Programmable Read-Only Memory) byte, a user can perform operations with respect to the memory, rather than bulk operations such as may be found in Flash memory (i.e., note, however, that "forming" can be implemented as a one time operation performed by a device manufacturer). A forming operation may be required to create the conducting filaments in order to operate the resistive memory apparatus 100. A set operation and a reset operation can be used to switch the resistance of the resistive memory apparatus 100 between LRS and HRS, respectively.

Figure 2:
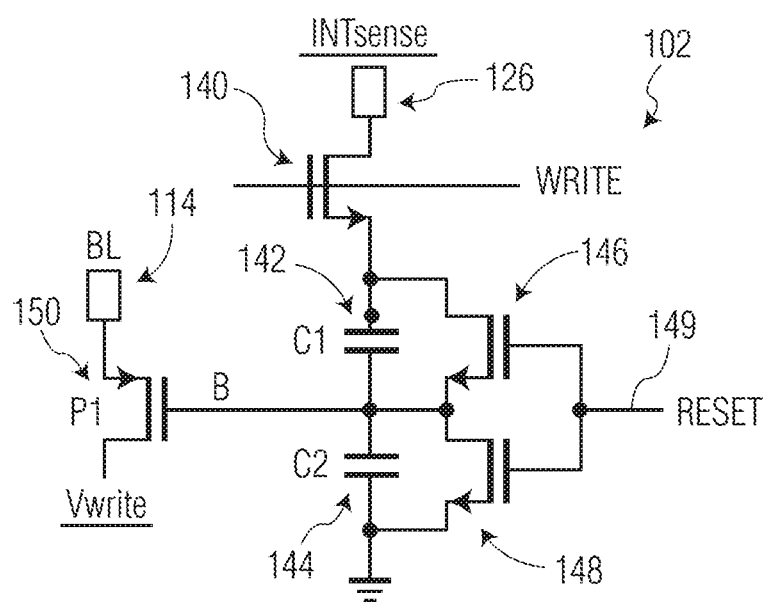
FIG. 2 depicts a circuit diagram of a bit line regulator.

FIG. 2 depicts a circuit diagram of a bit line regulator such as the bit line regulator 102. It can be appreciated that although the circuit diagram of bit line regulator 102 is shown in FIG. 2, similar circuit diagrams with similar electronic components can also be implemented for the bit line regulator 104 and the bit line regulator 102. Reference is made to bit line regulator 102 in FIG. 2 for ease of explanation.

The bit line regulator 102 shown in FIG. 2 can include a capacitor 142 (also labeled as "C1") that can be electronically connected to a capacitor 144 (also labeled as "C2"). The capacitor 144 can connect electronically to a transistor 148 and a transistor 146. The capacitor 142 can connect electronically to the transistor 146 and the transistor 148. The capacitor 142 can further connect electronically to a transistor 140, which in turn can connect to the intermediate sense line 126. The capacitor 142 and the capacitor 144 can further connect electronically to a transistor 150 that in turn connects to the bit line 114. The transistor 146 and the transistor 148 are connected to one another at their respective gates.

As further shown in FIG. 2, the bit line regulator 102 can include a node B, which may be used to control the voltage to the bit line 114 (also labeled as "BL") in FIG. 2. When a resistive element such as the resistive element 138 or the resistive elements of memory cells 204 and 206 are reset or manufactured at the "fab" with a "high resistance", the voltage of the intermediate sense line 126 (also labeled as "INTsense" in FIG. 2 where "INT" refers to "intermediate") can be approximately 0 volts. Note that the voltage at the intermediate sense line 126 can be as an INTsense voltage or an intermediate sense voltage and "INTsense" can also be referred to as "INTsense" node".

When one or more of the resistive elements such as the resistive element 138 or the resistive elements of memory cells 204 and 206 become increasingly conductive, the voltage of the bit line 114 can rise and the voltage at node B can arise as well. As the voltage of node B rises, the voltage of the bit line 114 may be reduced due to increased impedance of the transistor 150 (also labeled as "P1" in FIG. 2). The transistor 150 can also connect to a write voltage Vwrite as shown in FIG. 2. The voltage Vwrite can be a write voltage.

The capacitor 142 and the capacitor 144 can depend upon the behavior of the transistor 150 and one or more of the resistive elements such as the resistive element 138 of the memory cell 202 or the resistive elements associated with the memory cell 204 and the memory cell 206. The capacitor 142 and 144 can form a capacitor divider, which may be used to load the intermediate sense line 126 with DC (Direct Current) during a write operation.

Note that the terms "write" and "read" as utilized herein can relate to the ability to read and write data to or from a memory such as the disclosed memory cells. In other words, data can be accessed (read) or written to (write) individual storage locations such as the disclosed memory cells 202, 204, 206, 208, 210, 212, 214, 216, and 218 within the resistive memory apparatus 100. Such an exchange of data can occur via a read operation or a write operation. The choice of a read operation ("read") or a write operation ("write") can be determined by a read/write signal (e.g., a voltage pulse) applied to the resistive memory apparatus 100.

The transistor 140 can function as a write transistor, which can be used to isolate the intermediate sense line 126 from reset circuitry (not shown) for the capacitor divider. A reset signal 149 (also labeled as "Reset" in FIG. 2) can be input to the transistor 146 and the transistor 148, which are shown in FIG. 2 as tied to one another at their respective gates. The reset signal 149 can be applied to the bit line regulator 102 before a set operation, a reset operation, and a read operation, so that node B can be set to ground (0 volts).

In FIG. 2, the transistor 140 can be introduced to isolate the rest of the bit line regulator 102 from the intermediate sense line 126 (the "INTsense" node shown in FIG. 2) in modes other than a "write" mode. Thus, the gate electrode of the transistor 140 can be driven by a "write" signal (i.e., shown as "WRITE" in FIG. 2). The transistors 146 and 148 can be included to null the charge on the plates of capacitors 142 and 144 (i.e., C1 and C2, respectively). The transistors 146 and 148 can include gate electrodes connected together and driven by the reset signal 149 (also labeled "Reset" in FIG. 2). The capacitors 142 and 144, once reset can also lead to the node B (i.e., "B" in FIG. 2) to be at a ground potential before rising in response to the INTsense voltage.

Figure 3:
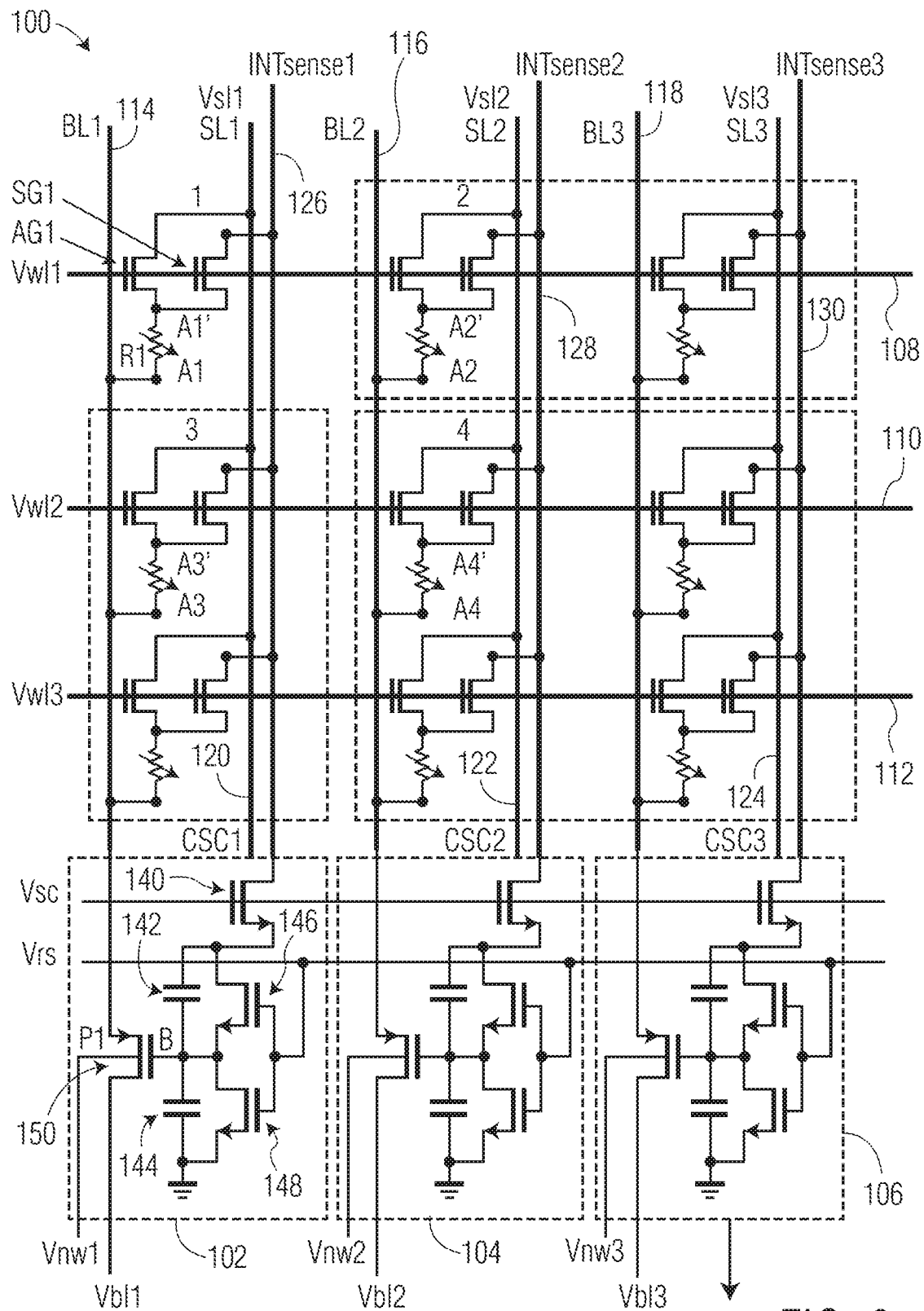
FIG. 3 depicts a circuit diagram of a resistive memory apparatus including voltage and bit parameters applicable during a forming/set operation.

FIG. 3 depicts a circuit diagram of a resistive memory apparatus 100 including voltage and bit parameters than can be applicable during a forming/set operation. Note that in FIG. 1 to FIG. 7, identical parts or elements can be indicated by identical reference numerals. Note that the acronym "CSC" as utilized herein can refer to a "control sense circuit". Thus, "CSC1" can refer to a first control sense circuit, "CSC2" can refer to a second control sense circuit, and "CSC3" can refer to a third control circuit. CSC1 can refer to the bit line regulator 102 and CSC2 can refer to the bit line regulator 104. In addition, CSC3 can refer to the bit line regulator 106. Additionally, in FIG. 3, "Vbl1" rcan refer to a first bit line voltage, "Vbl2" can refer to a second bit line voltage, and "Vbl3" can refer to a third bit line voltage".

The acronym "AG" can refer to an "assist gate". Thus, "AG1" can refer to a first assist gate, "AG2" can refer to a second assist gate, and so on. Additionally, the acronym "SG" can refer to a "sense gate". Thus, "SG1" can refer to a first sense gate, "SG2" can refer to a second sense gate and so on.

FIG. 4 depicts a table 160 demonstrating selected and unselected bits in a forming/set operation for the resistive memory apparatus 100 shown in FIG. 3.

Note that A1, A1', A2, A2', A3, A3' and A4, A4' can refer to nodes within the resistive memory apparatus 100, and R1, R2, R3, and R4 can refer to resistance values or resistors of the resistive memory apparatus 100. Thus, VA1 can refer to a voltage at node A1, and VA1A1' can refer to a voltage at nodes A1 and A1'. VA2 can refer to a voltage at node A2, and VA2A2' can refer to a voltage at nodes A2 and A2'. Likewise, VA3 can refer to a voltage at node A3, and VA3A3' can refer to a voltage at nodes A3 and A3'. VA4 can refer to a voltage at node A4, and VA4A4' can refer to a voltage at nodes A4 and A4'.

In the table 160, Bit1, Bit2, Bit3, and Bit4 are labeled respectively as 1(sel), 2(row), 3(col), and 4(diagonal) in respective headers 161, 163, 165, and 167. Bit1 can be the selected cell, and Bit2 can represent the unselected cells in the same row. Bit3 can represent unselected cells in the same column. Bit4 can represent unselected cells neither in the same row nor in the same column. Before a forming/set operation, a separate voltage pulse Vrs (e.g., a reset voltage) can be applied to set node B of the bit line regulator 102 to 0V.

At the beginning of a forming or set operation, a resistive element labeled as R1 in FIG. 4, (which can correspond to the resistive element 138 shown in FIG. 1) may be at an HRS (High Resistive State). A voltage Vbl1 (i.e., a "BL1" voltage) can be passed to a node A1 through P1 (which corresponds to the transistor 150 shown in FIG. 2), and a node A1' can be 0V, and a voltage $V_{A1A1'}$ can be approximately a voltage Vbl1 (which can be a first bit line voltage, also referred to as a "BL1 voltage")

When the filament in the resistive layer starts to be formed/set, R1 can be lowered and $V_{A1}$ can become higher and can be passed to node B through SC1 (which corresponds to the transistor 136 shown in FIG. 1), CSC1 and the capacitor divider, and the transistor P1 can become less conductive and the voltage $V_{A1A1'}$ can be further reduced to constrain the continuous forming of the filaments. Note that the voltage $V_{A2A2'}$, the voltage $V_{A3A3'}$ and the voltage $V_{A4A4'}$ can be approximately 0 V with either Vbl=0V or Vwl=0V. The voltage Vset can refer to a set voltage and Vform can refer to a formation voltage. Note that the voltage Vrs can refer to a reset voltage, and this reset voltage can relate to the reset of the capacitor divider.

Figure 5:
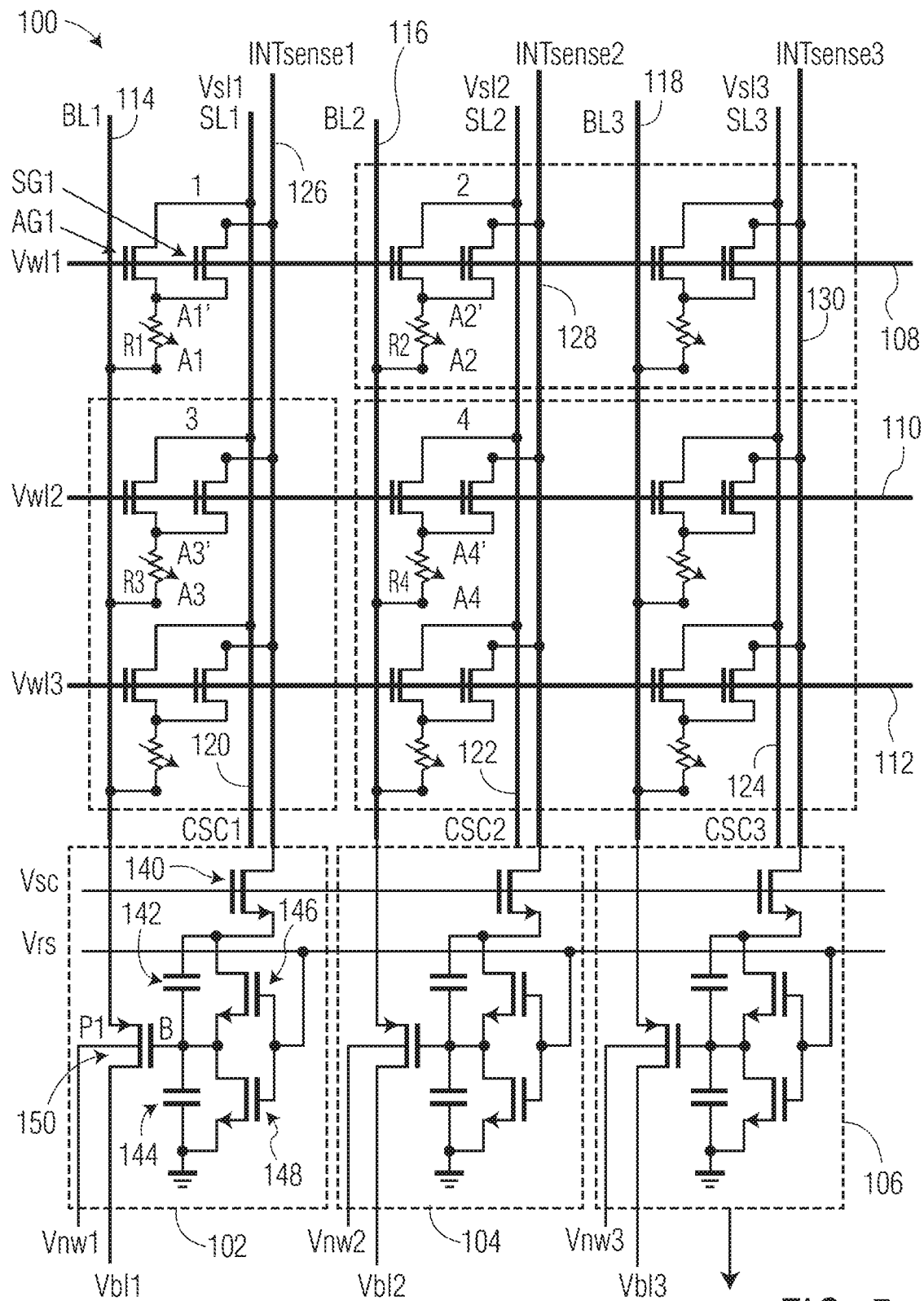
FIG. 5 depicts a circuit diagram of a resistive memory apparatus including voltage and bit parameters applicable during a reset operation or a read operation.

FIG. 5 depicts a circuit diagram of a resistive memory apparatus 100 including voltage and bit parameters applicable during a reset operation or a read operation. The circuit diagram of the resistive memory apparatus 100 shown in FIG. 5 is similar to the circuit diagram shown in FIG. 4, with the addition of labels such as R2, R3, and R4, which can represent other resistive elements (e.g., resistive storage elements) of the resistive memory apparatus 100.

Figure 6:
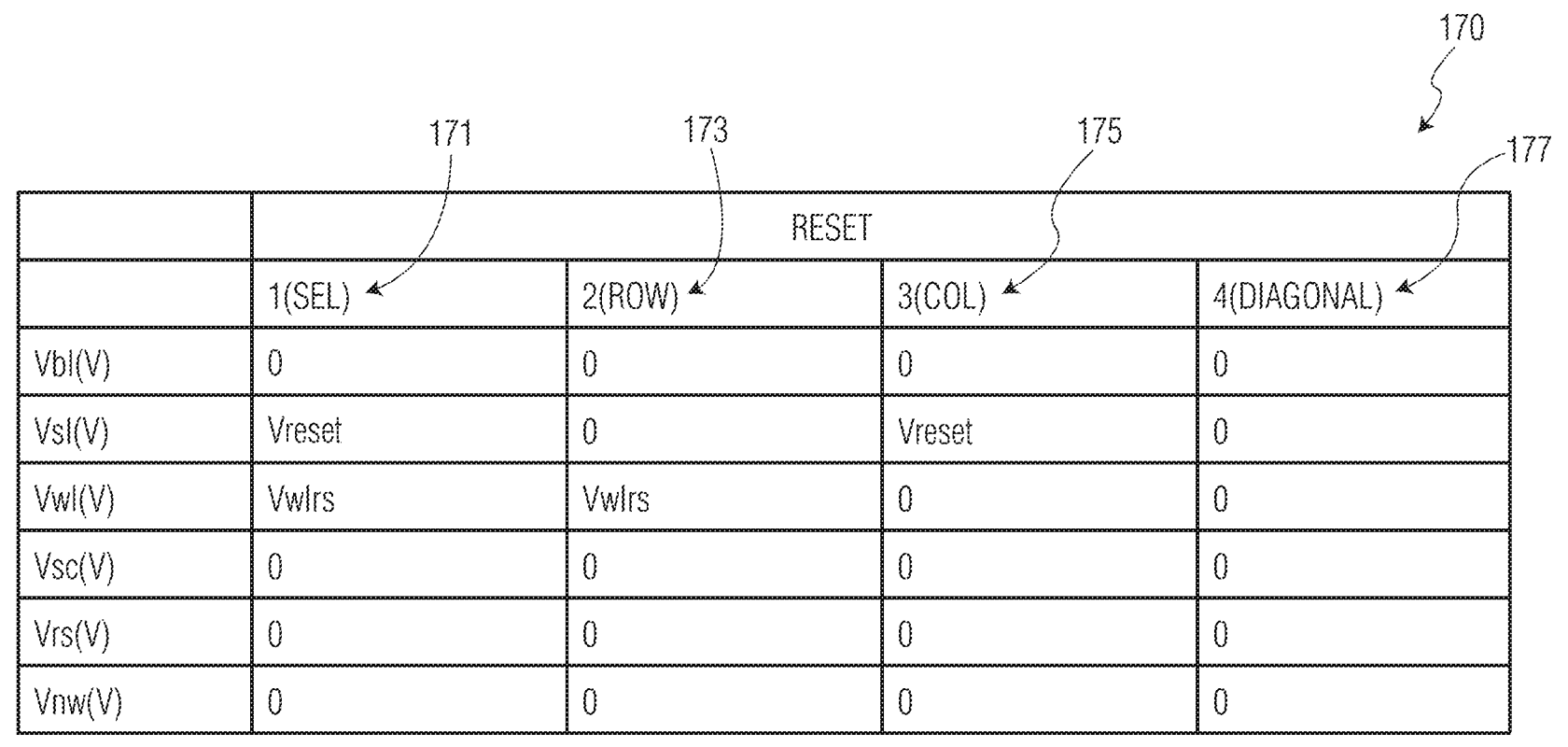

FIG. 6 depicts a Table 170 demonstrating selected and unselected bits that can be used in a reset operation for the resistive memory apparatus 100 shown in FIG. 5. Similar to the Table 160 shown in FIG. 5, the Table 170 depicted in FIG. 6 includes Bit1, Bit2, Bit3, and Bit4, which are respectively labeled as 1(sel), 2(row), 3(col), and 4(diagonal) in respective headers 171, 173, 175, and 177.

In Table 170, Vbl can refer to a bit line voltage (where "bl" can refer to "bit line"). Note that because in a reset write mode, the bit lines may be all at ground ("GND"), a ground path may be present on the either side of the bit line wherein during the reset, the bit lines can be all connected to GND (and hence decoding may not be needed). In addition, Vsl can refer to a source line voltage (where "sl" can refer to a source line), and Vwl refers to a word line voltage (where "wl" refers to word line).

Vsc can refer to a stacked capacitor voltage, and Vrs can refer to a reset voltage. During reset, the bit line regulator may not be not needed so Vrs may be used as the reset for the capacitors 142 and 144 and Vsc used for the connection of INTsense (i.e., intermediate sense line) to the stacked capacitors may be at GND, so the bit line regulator can be disabled). In a reset write mode, the INTsense can be connected to a source line to increase (e.g., double) the transistor strength for a memory cell transistor. In other words, the intermediate sense line can connect to the sense line in a reset write mode to increase a transistor strength of one or more of the transistors of a memory cell. Finally, Vreset can also refer to a reset voltage, and Vwlrs can refer to a word line reset voltage. The acronym "NW" or "nw" can refer to "N-Well". Thus, NW (N-Well), NW1 (N-Well1), etc. relate to the NW of the p-channel of the Bit Line regulator. Vnw, for example, can relate to the NW voltage of the p-channel of the transistor 140.

In a reset operation, the Vrs voltage pulse before a reset may be optional, because the potential associated with node B does may not modulate the reset behavior. In addition, during a reset operation (i.e., a "reset"), a memory cell can change from LRS (Low Resistive State) to HRS. Note that as discussed earlier, the BL ("bit line") can be connected to GND ("ground") not through a well diode but through a transistor (N-channel) pull-down. Note that at least an n-channel device can be connected to every BL of the array to provide a connection to a GND signal. The bit line regulator 102 can be disconnected with CSC1 at the off state. Additionally, current does not flow through R3, with Vwl2 at the off state. Current also does not flow through R2 and R4 with Vsl2 at 0V.

FIG. 7 depicts a table demonstrating selected and unselected bits in a read operation for the resistive memory apparatus 100. Similar to the previously discussed Table 160 shown in FIG. 5 and Table 170 depicted in FIG. 6, the Table 180 shown in FIG. 7 includes Bit1, Bit2, Bit3, and Bit4, which are respectively labeled as 1(sel), 2(row), 3(col), and 4(diagonal) in respective headers 181, 133, 185, and 187.

The Table 180 shown in FIG. 7 indicates that the Vrs voltage pulse is optional, because the node B potential does not module read behavior. The read operation for the resistive memory apparatus 100 is similar to the reset operation in some respects, but can differ in others. For example, a Vread ("read" voltage) signal can be applied through SL and the bit line regulator 102 can be disconnected from the resistive memory apparatus 100 with CSC at the off state. Note that an n-channel transistor can connect all bit lines to GND whenever there is a READ operation or a RESET write operation. For Bit2 and Bit 4, no current with Vsl2 may be approximately at 0V. For Bit3, almost no current may be present with Vwl2 at 0V.

Figure 8:
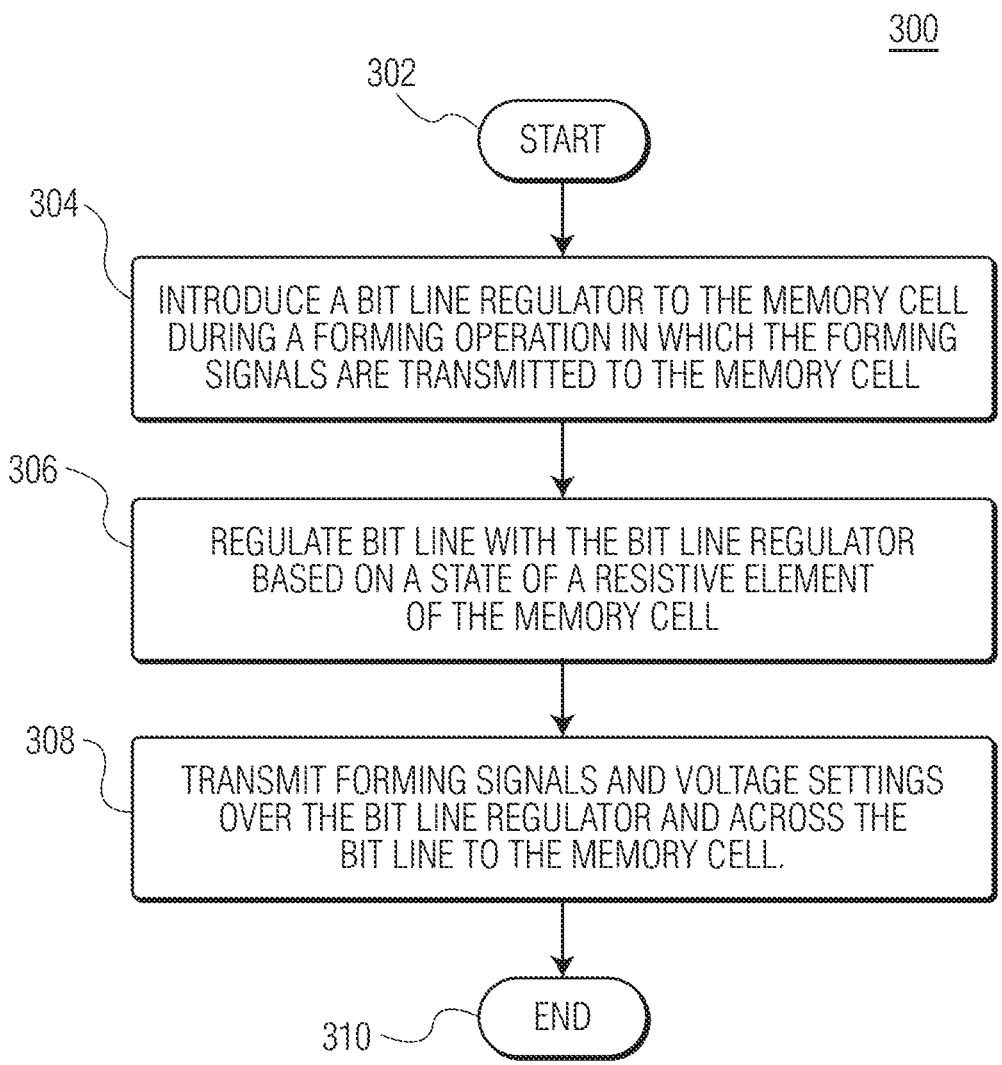
FIG. 8 depicts a flow diagram illustrating logical operational steps of a method of operating a resistive memory apparatus.

FIG. 8 depicts a flow diagram illustrating logical operational steps of a method 300 of operating a resistive memory apparatus (e.g., such as the resistive memory apparatus 100). As indicated at block 302, the process can be initiated. As shown at block 304, a bit line regulator can be introduced to a memory cell during a forming operation in which forming signals are transmitted to the memory cell. Next, as shown at block 306, a bit line can be regulated with the bit line regulator based on the state of a resistive element of a memory cell (i.e., as discussed previously—a memory cell can include at least two transistors and a resistive element, and the bit line can interconnect electronically to the memory cell). Thereafter, as depicted at block 308, formation signals and voltage settings can be transmitted over the bit line regulator and across the bit line to the memory cell. The process can then end, as shown at block 310.

Although the operations of the method(s) herein are shown and described in a particular order, the order of the operations may be altered so that certain operations may be performed in an inverse order or so that certain operations may be performed, at least in part, concurrently with other operations. In another embodiment, instructions or sub-operations of distinct operations may be implemented in an intermittent and/or alternating manner.

At least some of the operations for the method(s) described herein can be implemented using software instructions stored on a computer usable storage medium for execution by a computer. As an example, an embodiment of a computer program product includes a computer usable storage medium to store a computer readable program.

The computer-usable or computer-readable storage medium can be an electronic, magnetic, optical, electromagnetic, infrared, or semiconductor system (or apparatus or device). Examples of non-transitory computer-usable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), a digital video disk (DVD), Flash memory, and so on.

Alternatively, embodiments of the invention may be implemented in hardware or in an implementation containing hardware and software elements. In embodiments that do utilize software, the software may include firmware, resident software, microcode, etc.

In some alternative implementations, the functions noted in the blocks may occur out of the order noted in the figures. For example, two blocks shown in succession may, in fact, be executed concurrently, or the blocks may sometimes be executed in the reverse order, depending upon the functionality involved. It will also be noted that the blocks of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A resistive memory apparatus, comprising:
   a memory cell that includes at least two transistors and a resistive element;
   a word line connected to the at least two transistors;
   an intermediate sense line connected to one transistor of the at least two transistors;

a source line connected to another transistor of the at least two transistors;

a bit line through which data is exchanged with the memory cell, wherein the bit line electronically interconnects with the resistive element of the memory cell; and a bit line regulator connected to the bit line and selectively connected to the intermediate sense line based on a control signal, wherein the bit line regulator regulates the bit line based on a state of the resistive element.

2. The resistive memory apparatus of claim 1 wherein the resistive element comprises a variable resistor.

3. The resistive memory apparatus of claim 1 wherein the bit line regulator is selectively connected to the intermediate sense line only during either a forming or set operation of the memory cell.

4. The resistive memory apparatus of claim 3 wherein the bit line regulator includes a capacitor divider that connects to the intermediate sense line during the forming and set operations of the memory cell.

5. The resistive memory apparatus of claim 1 wherein the bit line regulator is disconnected from the intermediate sense line during both reset and read operations of the memory cell.

6. The resistive memory apparatus of claim 5 wherein the intermediate sense line connects to the source line in a reset write mode to increase a transistor strength of at least one of the at least two transistors of the memory cell.

7. The resistive memory apparatus of claim 1 further comprising a RRAM (Resistive Random Access Memory) that includes the memory cell, the bit line and the bit line regulator.

8. The resistive memory apparatus of claim 1 wherein the resistive element comprises a resistive storage element.

9. A resistive memory apparatus, comprising:
a plurality of memory cells, wherein each memory cell among the plurality of memory cells comprises at least two transistors and a resistive element;
at least one word line connected to the at least two transistors of each memory cell of the plurality of memory cells;
at least one intermediate sense line connected to a first transistor of the at least two transistors of each memory cell of the plurality of memory cells;
at least one source line connected to a second transistor of the at least two transistors;
at least one bit line through which data is exchanged with the plurality of memory cells, wherein the at least one bit line electronically interconnects with the plurality of memory cells; and
at least one bit line regulator connected to at least one of the plurality of bit lines and selectively connected to the at least one intermediate sense line based on a control signal, wherein the at least one bit line regulator regulates the plurality of bit lines based on a state of the resistive element.

10. The resistive memory apparatus of claim 9 wherein the resistive element comprises a variable resistor.

11. The resistive memory apparatus of claim 9, wherein the at least one bit line regulator is selectively connected to the intermediate sense line only during either a forming or set operation of a selected one of the plurality of memory cells.

12. The resistive memory apparatus of claim 11 wherein the at least one bit line regulator is disconnected from the intermediate sense line during both reset and read operations of a memory cell of the plurality of memory cells.

13. The resistive memory apparatus of claim 11 wherein the at least one bit line regulator includes a plurality of capacitors that connect to a plurality of transistors, wherein at least one transistor among the plurality of transistors connects to an intermediate sense line of the at least one intermediate sense line and at least one other transistor among the plurality of transistors connects to a bit line among the at least one bit lines.

14. In a resistive memory apparatus having a plurality of memory cells, each memory cell of the plurality of memory cells having at least two transistors and a resistive element, a word line connected to the at least two transistors, an intermediate sense line connected to one transistor of the at least two transistors, a source line connected to another one transistor of the at least two transistors, a bit line connected to the resistive element, a method of operating the resistive memory apparatus, comprising:
regulating the bit line with a bit line regulator connected to the bit line and selectively connected to the intermediate sense line based on a control signal, wherein the bit line regulator regulates the bit line based on a state of the resistive element of a memory cell.

15. The method of claim 14 wherein the resistive element comprises a variable resistor.

16. The method of claim 14 further comprising selectively connecting the bit line regulator to the intermediate sense line only during a forming operation or a set operation of the memory cell.

17. The method of claim 14 further comprising disconnecting the bit line regulator from the intermediate sense line during both reset and read operations of the memory cell.

18. The method of claim 17 wherein the intermediate sense line connects to the source line during the reset operation to increase a transistor strength of at least one of the at least two transistors of the memory cell.

19. The method of claim 14 wherein the bit line regulator includes a capacitor divider that connects to the intermediate sense line during the forming operation or the set operation of the memory cell.

20. The method of claim 14 wherein the resistive memory apparatus comprises a RRAM (Resistive Random Access Memory) that includes the memory cell, the bit line and the bit line regulator.

* * * * *